(12) United States Patent
Su et al.

(10) Patent No.: US 9,023,448 B2
(45) Date of Patent: May 5, 2015

(54) SUBSTRATE STRUCTURES APPLIED IN FLEXIBLE DEVICES

(71) Applicant: Industrial Technology Research Institute, Chutung, Hsinchu (TW)

(72) Inventors: Pei-Ju Su, Hsinchu (TW); Pao-Ming Tsai, Kaohsiung (TW); Liang-You Jiang, New Taipei (TW); Chyi-Ming Leu, Hsinchu County (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 0 days.

(21) Appl. No.: 13/774,104

(22) Filed: Feb. 22, 2013

(65) Prior Publication Data

US 2014/0242318 A1 Aug. 28, 2014

(51) Int. Cl.
*B32B 7/06* (2006.01)
*G09F 3/02* (2006.01)
*H05K 1/03* (2006.01)

(52) U.S. Cl.
CPC .............. *B32B 7/06* (2013.01); *Y10T 428/1476* (2015.01); *G09F 3/02* (2013.01); *H05K 1/0393* (2013.01)

(58) Field of Classification Search
CPC .............. B32B 7/06; B32B 7/12; G09F 3/02; G09F 3/10; G09F 9/30; H05K 3/007; H05K 1/0393; H05K 2203/016; H01L 51/0097; Y10T 428/14; Y10T 428/1476; Y10T 428/2839; Y10T 428/2848
See application file for complete search history.

(56) References Cited

U.S. PATENT DOCUMENTS

| | | | |
|---|---|---|---|
| 6,572,780 B2 | 6/2003 | McCormack et al. | |
| 7,223,672 B2 | 5/2007 | Kazlas et al. | |
| 7,466,390 B2 | 12/2008 | French et al. | |
| 7,655,289 B2 | 2/2010 | Hubert et al. | |
| 7,939,425 B2 | 5/2011 | Hu et al. | |
| 7,947,351 B1 * | 5/2011 | Cowan | 428/40.1 |
| 8,173,249 B2 | 5/2012 | Leu et al. | |
| 8,182,892 B2 * | 5/2012 | Huang et al. | 428/40.1 |
| 2003/0201064 A1 * | 10/2003 | Treleaven et al. | 156/250 |
| 2010/0068483 A1 * | 3/2010 | Leu et al. | 428/212 |
| 2012/0052214 A1 | 3/2012 | Tsai et al. | |

OTHER PUBLICATIONS

Utsunomiya et al., "Flexible Color AM-OLED Display Fabricated Using Surface Free Technology by Laser Ablation/Annealing (SUFTLA®) and Ink-jet Printing Technology", SID Symposium Digest of Technical Papers 2003, p. 864-867.

French et al., "Thin plastic electrophoretic displays fabricated by a novel process", SID Symposium Digest of Technical Papers, 2005, p. 1634-1637.

(Continued)

*Primary Examiner* — Patricia L Nordmeyer
(74) *Attorney, Agent, or Firm* — Muncy, Geissler, Olds & Lowe, P.C.

(57) ABSTRACT

A substrate structure applied in flexible devices is provided. The substrate structure includes a carrier; a release layer with a first area formed on the carrier, which has a first adhesion force to the carrier; and a flexible substrate with a second area overlying part of the first area of the release layer and contacting the carrier, which has a second adhesion force to the release layer and a third adhesion force to the carrier, wherein the first area is larger than or equal to the second area, the third adhesion force is greater than the first adhesion force, and the first adhesion force is greater than the second adhesion force.

5 Claims, 7 Drawing Sheets

(56) References Cited

OTHER PUBLICATIONS

Souk et al., "A practical approach to processing flexible displays", Journal of the SID, 2010, vol. 18/4, p. 258-265.
Lee et al., "A Novel Approach to Make Flexible Active Matrix Displays", SID Symposium Digest of Technical Papers, 2010, p. 810-813.
Chen et al., "A flexible universal plane for displays", Information Display, Feb. 2011, vol. 27(2), p. 6-9.
Liu et al., "High-performance organic-inorganic hybrid plastic substrate for flexible displays and electronics", Journal of the SID, 2011, vol. 19/1, p. 63-69.
Ho et al., "A Novel Flexible AMOLED with Touch Based on Flexible Universal Plane for Display Technology", SID Symposium Digest of Technical Papers 2011 Digest, 2011, p. 625-628.

* cited by examiner

SUBSTRATE STRUCTURES APPLIED IN FLEXIBLE DEVICES

BACKGROUND

1. Technical Field

Technical field relates to a substrate structure applied in flexible devices.

2. Description of the Related Art

The flexible display is a display that is, like paper, bendable and rollable using a flexible substrate. As it is using plastic materials and films for substrates, it is not only lighter and thinner but also unbreakable upon impact, the flexible display is considered for mobile devices, such as a digital camera, a personal digital assistant (PDA), a smart phone, or a tablet. One of the technologies required for manufacturing flexible devices is the technology that forms the TFT (thin film transistor) array and/or display mediums on flexible substrates.

Fabrication processes are divided into batch type and roll to roll. A TFT apparatus can utilize batch type processes. However, development of substrate-transfer and film-separation techniques is required. The flexible display devices must be transferred to other plastic substrates from glass substrate. For flexible display devices using roll to roll fabrication processes, new equipment is required and some problems caused by rolling and contact must be overcome.

The batch type process is generally categorized into three: the laminated plastic, the transfer to plastic, and the coating plastic. A polyethersulfone (PES) substrate is attached on a carrier plate using the adhesives which can be delaminated by temperature or UV light control. A transmissive type plastic TFT-LCD is developed under that both the processes of TFT and color filter are carried out below 150° C. on PES plastic films. In this manner, a transparent plastic substrate with heat-resistance, a low thermal expansion coefficient and chemical stability is required, and reliable method for bonding preformed plastic substrate to glass substrate before MT processing and then releasing them after TFT processing is necessary.

A low temperature poly-silicon (LIPS) TFT arrays are made on amorphous silicon and silicon dioxide layers on glass. The top of the TFT array is then stuck to a first plastic substrate with water-soluble glue and the TFT layers are freed from the bottom substrate by using a XeCl laser to irradiate the bottom a-Si layer through the glass. The laser beam causes hydrogen exodiffusion, and the released hydrogen lifts the TFTs from the original glass substrate. Then, a second plastic substrate is laminated to the bottom of the TFT array using a permanent adhesive. The array is then released from the first plastic substrate by dissolving the water-soluble glue. This is a double transfer process.

A polyimide layer is applied to a glass substrate by spin coating before TFT array fabrication. The polyimide layer will ultimately become the plastic substrate of the flexible display device. This approach shows that manufacturing can be carried out in well-established factories using existing processes. However, this method also requires a laser beam incident through the back of the glass to decouple the polyimide layer from the glass substrate.

SUMMARY

One embodiment of the disclosure provides a substrate structure applied in flexible devices, comprising: a carrier; a release layer with a first area formed on the carrier, which has a first adhesion force to the carrier; and a flexible substrate with a second area overlying part of the first area of the release layer and contacting the carrier, which has a second adhesion force to the release layer and a third adhesion force to the carrier, wherein the first area is larger than or equal to the second area, the third adhesion force is greater than the first adhesion force, and the first adhesion force is greater than the second adhesion force.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
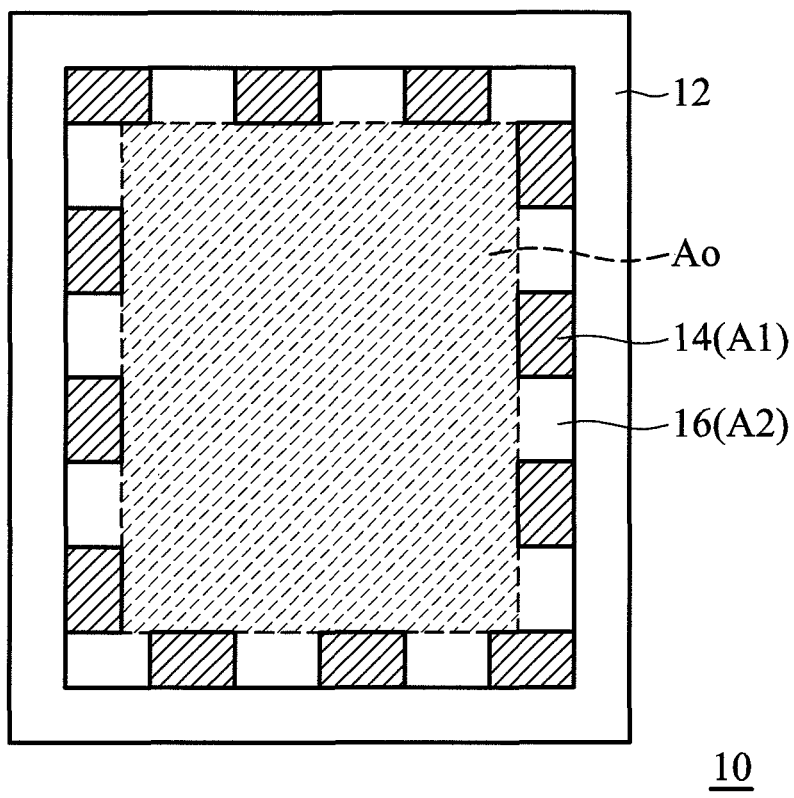
FIG. 1 is a top view of a substrate structure (with a patterned release layer and a patterned flexible substrate) applied in flexible devices according to an embodiment of the disclosure.

In the following detailed description, for the purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

In an embodiment, a substrate structure applied in flexible devices of the disclosure is shown in FIG. 1. A substrate structure 10 comprises a carrier 12, a patterned release layer 14 with a first area A1 and a patterned flexible substrate 16 with a second area A2. In this embodiment, both the release layer 14 and the flexible substrate 16 are patterned. The patterned release layer 14 with the first area A1 is formed on the carrier 12. The patterned flexible substrate 16 with the second area A2 overlies part of the first area A1 of the patterned release layer 14 and a portion of the flexible substrate 16 directly contacts the carrier 12. The release layer 14 has a first adhesion force to the carrier 12. The flexible substrate 16 has a second adhesion force to the release layer 14 and a third adhesion force to the carrier 12. Specifically, the first area A1 is substantially equal to the second area A2, the third adhesion force is greater than the first adhesion force and the first adhesion force is greater than the second adhesion force.

Additionally, the flexible substrate 16 overlies the part of the release layer 14 to form an overlapping area Ao therebetween. The flexible substrate 16 and the release layer 14 are in an alternate arrangement outside the overlapping area Ao.

Figure 2:
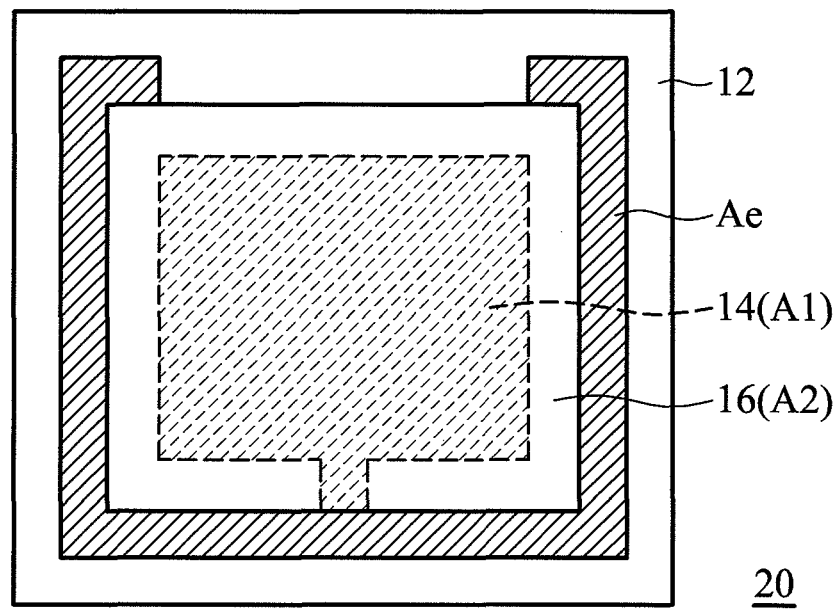
FIG. 2 is a top view of a substrate structure (with a patterned release layer) applied in flexible devices according to an embodiment of the disclosure.

In an embodiment, a substrate structure applied in flexible devices of the disclosure is shown in FIG. 2. A substrate structure 20 comprises a carrier 12, a patterned release layer 14 with a first area A1 and a flexible substrate 16 with a second area A2. In this embodiment, only the release layer 14 is patterned. The patterned release layer 14 with the first area A1 is formed on the carrier 12. The flexible substrate 16 with the second area A2 overlies part of the first area A1 of the patterned release layer 14 and a portion of the flexible substrate 16 directly contacts the carrier 12. The release layer 14 has a first adhesion force to the carrier 12. The flexible substrate 16 has a second adhesion force to the release layer 14 and a third adhesion force to the carrier 12. Specifically, the first area A1 is substantially equal to the second area A2, the third adhesion force is greater than the first adhesion force and the first adhesion force is greater than the second adhesion force.

Figure 3:
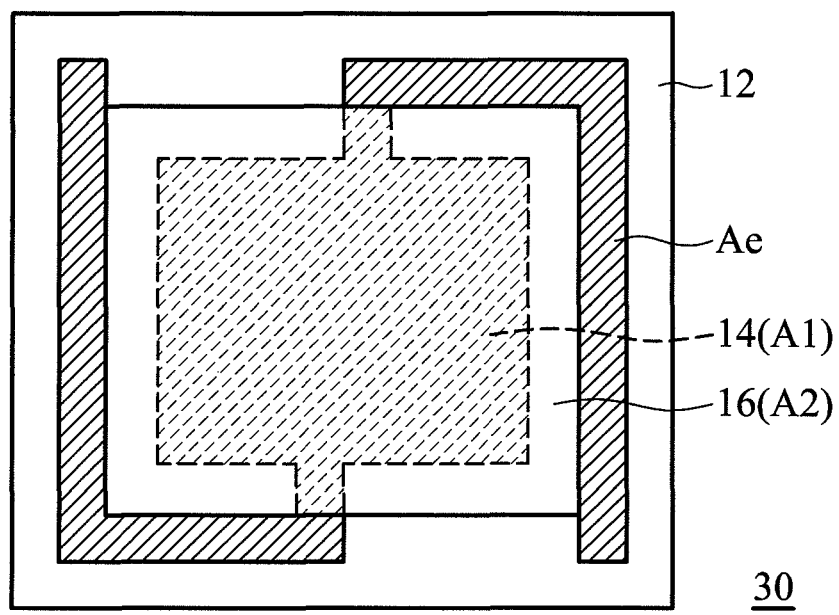
FIG. 3 is a top view of a substrate structure (with a patterned release layer) applied in flexible devices according to an embodiment of the disclosure.
Figure 4:
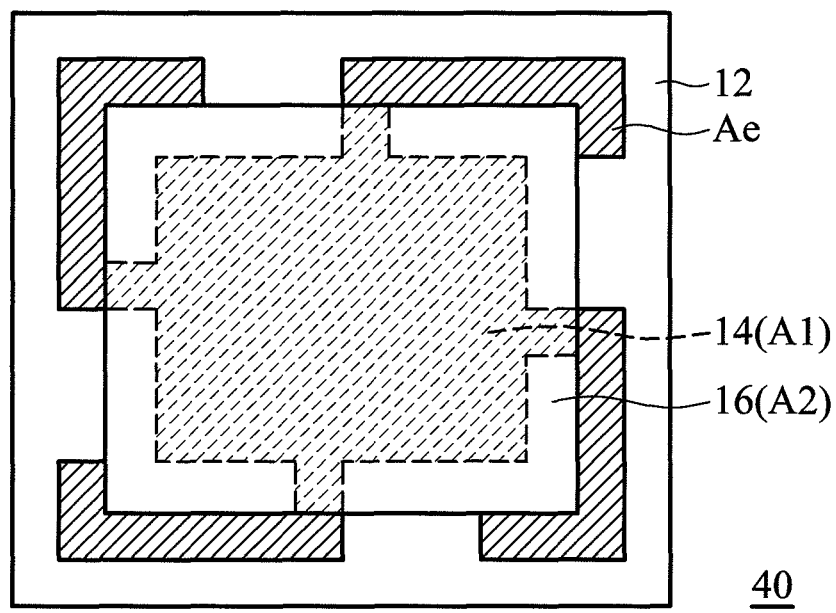
FIG. 4 is a top view of a substrate structure (with a patterned release layer) applied in flexible devices according to an embodiment of the disclosure.
Figure 5:
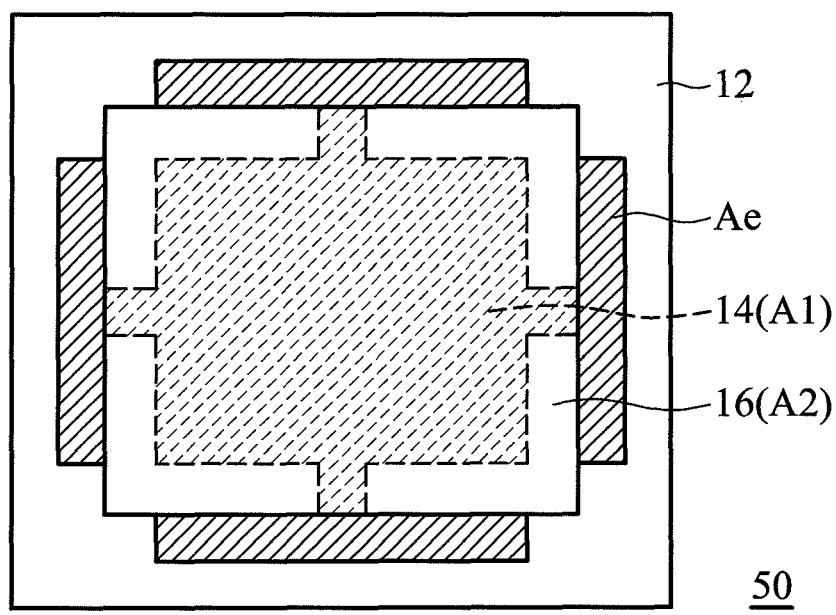
FIG. 5 is a top view of a substrate structure (with a patterned release layer) applied in flexible devices according to an embodiment of the disclosure.

The substrate structures (for example 30, 40 and 50) of FIGS. 3-5 are similar to the substrate structure 20 of FIG. 2. The distinctions therebetween are various patterned release layer profiles. In FIGS. 2-5, the release layer 14 further comprises at least one extending area Ae outside the flexible substrate 16 uncovered by the flexible substrate 16. In other embodiments, the patterns of the release layer 14 and the flexible substrate 16 may be interchanged.

Figure 6:
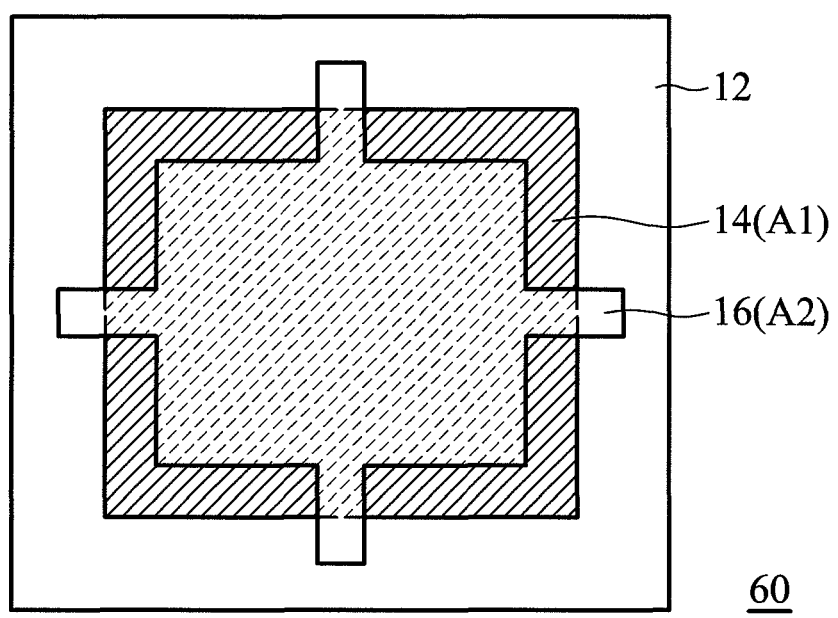
FIG. 6 is a top view of a substrate structure (with a patterned flexible substrate) applied in flexible devices according to an embodiment of the disclosure.

In an embodiment, a substrate structure applied in flexible devices of the disclosure is shown in FIG. 6. A substrate structure 60 comprises a carrier 12, a release layer 14 with a first area A1 and a patterned flexible substrate 16 with a second area A2. In this embodiment, only the flexible substrate 16 is patterned. The release layer 14 with the first area A1 is formed on the carrier 12. The patterned flexible substrate 16 with the second area A2 overlies part of the first area A1 of the release layer 14 and a portion of the flexible substrate 16 directly contacts the carrier 12. The release layer 14 has a first adhesion force to the carrier 12. The flexible substrate 16 has a second adhesion force to the release layer 14 and a third adhesion force to the carrier 12. Specifically, the first area A1 is substantially larger than the second area A2, the third adhesion force is greater than the first adhesion force and the first adhesion force is greater than the second adhesion force.

In FIGS. 1-6, the carrier 12 may comprise a rigid substrate such as a glass substrate, a silicon wafer, a quartz substrate, a ceramic substrate, a metal substrate, or a stainless steel substrate. The rigid substrate maintains an original shape without distortion even when moved or carried.

The release layer 14 may be parylene, or cyclic olefin copolymers (COC). In one embodiment, the release layer 14 may comprise organic materials including parylene group materials, for example, parylene N, parylene C or parylene D, with the C—H functional group. The identical recurring unit of the release layer 14 formed of parylene is formed by an identical recurring unit of Formula I, Formula II or Formula III, wherein n>20. In one embodiment, the release layer 14 may comprise cyclic olefin copolymers (COC) represented by the Formula IV or Formula V. In Formula IV or Formula V, X is 30-70, X+Y is 100 and R is —H, —CH$_3$ or —C$_2$H$_5$.

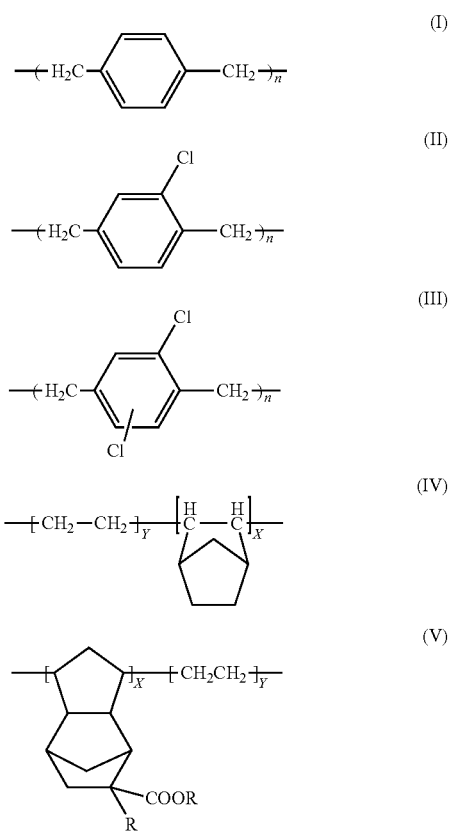

The flexible substrate 16 may be a flexible display substrate, for example, an active flexible display substrate. The flexible substrate 16 may comprise polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI). Alternatively, the flexible substrate 16 may have a multi layered structure including the layer previously discussed.

The polyimide (PI) flexible substrate 16 has the formula (VI):

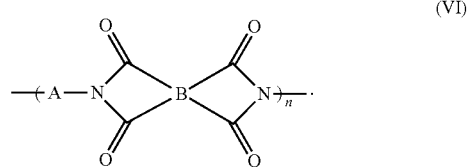

In formula (VI), A may comprise

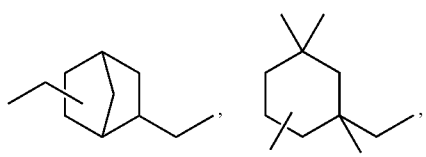

-continued

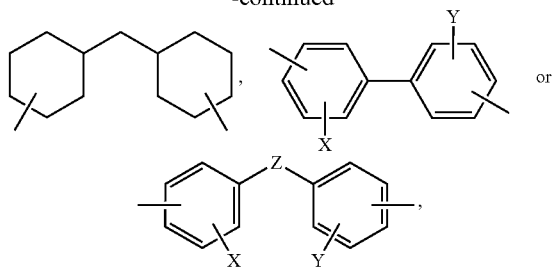

wherein X and Y may comprise hydrogen, methyl, trifluoromethyl, hydroxyl, —OR, bromine, chlorine or iodine, and Z may comprise —O—, —CH$_2$—, —C(CH$_3$)$_2$—, —SO$_2$—, —Ar—O—Ar—, —Ar—CH$_2$—Ar—, —Ar—C(CH$_3$)$_2$—Ar— or —Ar—SO$_2$—Ar—, wherein R may comprise C$_{1-18}$ alkyl, and Ar is aromatic group. B may comprise

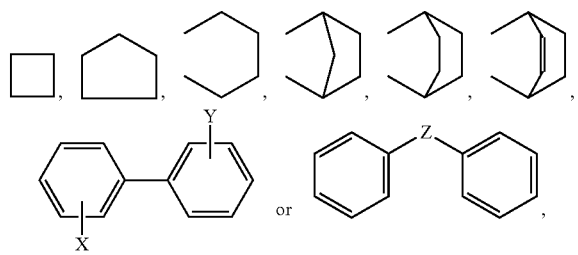

wherein X and Y may comprise hydrogen, methyl, trifluoromethyl, hydroxyl, —OR, bromine, chlorine or iodine, and Z may comprise —O—, —CH$_2$—, —C(CH$_3$)$_2$—, —SO$_2$—, —Ar—O—Ar—, —Ar—CH$_2$—Ar—, —Ar—C(CH$_3$)$_2$—Ar— or —Ar—SO$_2$—Ar—, wherein R may comprise C$_{1-18}$ alkyl, and Ar is aromatic group. n may be an integer greater than 1.

The flexible substrate 16 may further comprise siloxane compounds or silicon dioxide to increase its adhesion force to the carrier 12.

The second adhesion force of the flexible substrate 16 to the release layer 14 is less than or equal to 50 gf/inch, preferably, less than 20 gf/inch, most preferably, less than 10 gf/inch. The third adhesion force of the flexible substrate 16 to the carrier 12 is greater than 50 gf/inch, preferably, greater than 100 gf/inch, most preferably, greater than 200 gf/inch.

The adhesion force (=de-bonding force) is determined in accordance with ASTM standard D429, 90° peeling test, and the results are reported in gf/inch.

The present substrate structure may be applied to various flexible devices such as a flexible electronic display, a flexible electronic touch panel, a flexible solar cell, a flexible electronic sensor, a flexible bioprobe or other flexible devices.

Figure 7A:
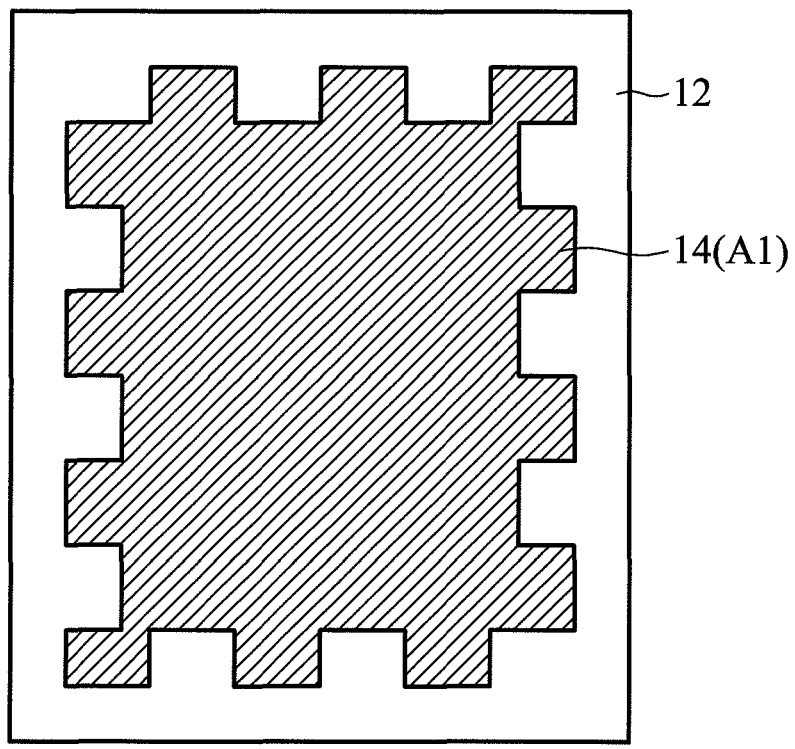
FIGS. 7A-7B are top views of a method for fabricating a substrate structure applied in flexible devices according to an embodiment of the disclosure.
Figure 7B:
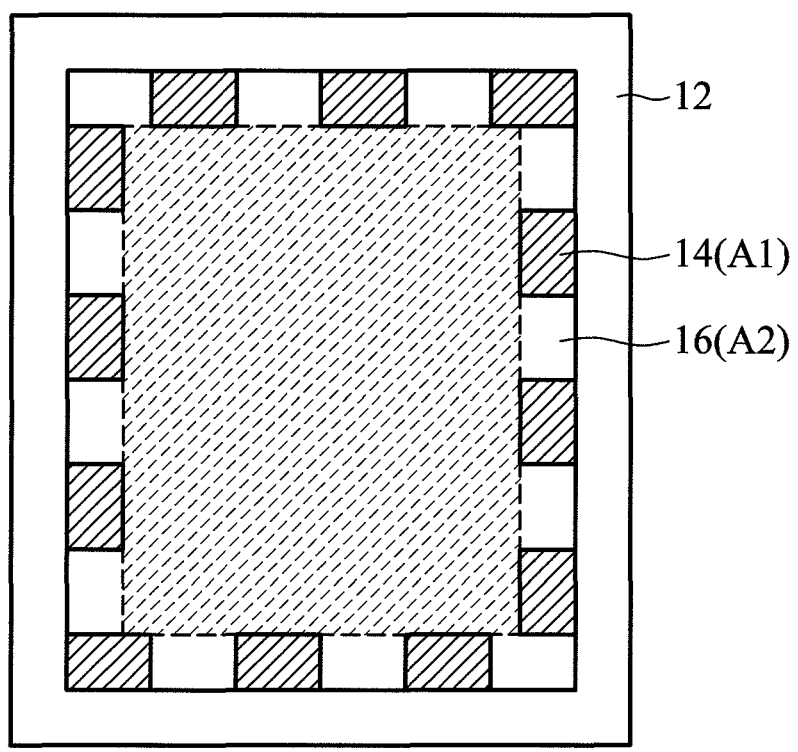
Figure 7C:
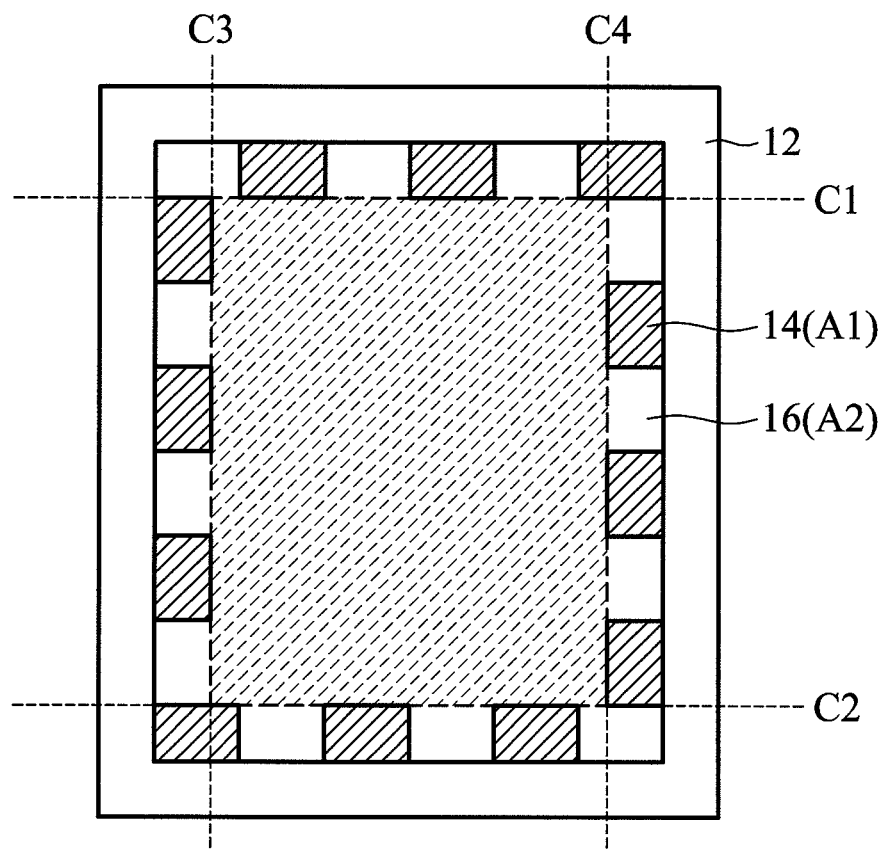
FIG. 7C is a top view of a cutting process of the substrate structure fabricated by the method of FIGS. 7A-7B.
Figure 7D:
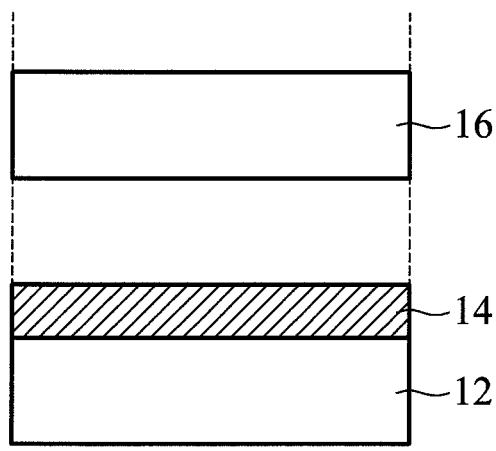
FIG. 7D is a cross-sectional view of a separated substrate structure after the cutting process of FIG. 7C.

In an embodiment, a method for fabricating a substrate structure applied in flexible devices and a cutting process of the substrate structure of the disclosure are shown in FIGS. 7A-7D, wherein FIG. 7D is a cross-sectional view of a separated substrate structure after the cutting process.

Referring to FIG. 7A, a carrier 12 having a patterned release layer 14 with a first area A1 formed thereon is provided. The patterned release layer 14 is formed on the carrier 12 by, for example, coating or evaporation and then a patterning process. In an embodiment, the patterned release layer 14 is deposited on the carrier 12 through a patterned deposition mask. In another embodiment, the patterned release layer 14 is coated on the carrier 12 through various pattern-coating methods such as screen printing, flexography printing, or inkjet printing.

Next, referring to FIG. 7B, a patterned flexible substrate 16 with a second area A2 overlies part of the first area A1 of the patterned release layer 14 and a portion of the flexible substrate 16 directly contacts the carrier 12, such as by coating. In an embodiment, an unpatterned flexible substrate is first formed through spin coating, slit coating or slot die coating, and then patterned through photolithography. In another embodiment, the patterned flexible substrate 16 is directly formed through screen printing, flexography printing or inkjet printing. The release layer 14 has a first adhesion force to the carrier 12. The flexible substrate 16 has a second adhesion force to the release layer 14 and a third adhesion force to the carrier 12. Specifically, the first area A1 is equal to the second area A2, the third adhesion force is greater than the first adhesion force and the first adhesion force is greater than the second adhesion force.

Next, referring to FIG. 7C, a dividing process is performed. A laser, a cutter or the like can be used as a dividing method. Portions of the patterned flexible substrate 16, the patterned release layer 14 and the carrier 12 are divided along the lines C1, C2, C3 and C4 (e.g., cutting the portion of the patterned flexible substrate 16 which contacts the carrier 12 away) to separate the flexible substrate 16, as shown in FIG. 7D. In this embodiment specifically, the release layer 14 is left on the carrier 12 due to the first adhesion force of the release layer 14 to the carrier 12 being greater than the second adhesion force of the flexible substrate 16 to the release layer 14.

The substrate structure applied in flexible devices provided by the disclosure can be used in present semiconductor or thin film transistor fabrication equipment and handling apparatuses, characterized by the relationship between the flexible substrate and the release layer in area size, and the relationships between the release layer and the carrier, the flexible substrate and the release layer, and the flexible substrate and the carrier, in terms of adhesion force. The release layer with an area and a lower adhesion force to the carrier is first formed on the carrier. The flexible substrate (such as a flexible display substrate) with an area and a greater adhesion force to the carrier then overlies part of the area of the release layer and a portion of the flexible substrate 16 directly contacts the carrier. Specifically, the area of the flexible substrate is less than or equal to the area of the release layer and the adhesion force of the release layer to the carrier is greater than the adhesion force of the flexible substrate to the release layer. According to the above-mentioned structural features, during and/or after TFT processing and display making, the flexible substrate remains attached to the carrier, without peeling off. After a separation step, the flexible substrate is de-bonded from the original structure and the release layer is left on the carrier.

When the area of the release layer is greater than or equal to that of the flexible substrate, if granting the release layer thermal conductivity or determined stress property such as tensile stress or compressive stress, the heat dissipation of the substrate structure can be promoted or the internal stress of the substrate structure can be balanced, further lowering the possibility of carrier's deformation during the subsequent high-temperature processes and improving the stability of the manufacturing process. Besides, when separating the flexible substrate, providing a starting point being easily separated is imperative. Part of the release layer exposes outside of the flexible substrate (for instance, the release layer is not fully covered by the flexible substrate) through the design of the patterned release layer or the patterned flexible substrate of the disclosure, it can lower the situation of poor separation by creating at least one starting point with worse adhesion force.

Example 1

Preparation of Parylene Release Layer

A parylene precursor (parylene dimer) was put into a thermal evaporation apparatus. A clean glass (15 cm×15 cm) shield with a deposition mask (8 cm×8 cm) was placed in a sample room. The parylene precursor was vaporized at 150° C. and decomposed at 650° C. in a vacuum and then conducted into the sample room. Parylene was deposited on the region designed by the deposition mask at room temperature. A patterned parylene release layer (8 cm×8 cm) was prepared.

Example 2

Preparation of Arton, Topas and Zeonor Release Layer

A tape was stuck on a determined area of a glass. Arton, Topas or Zeonor (with 10% solid content dissolved in toluene) was then coated on the glass using a blade. The tape was removed. The glass was baked in various temperature ovens (80° C. and 150° C.) for 0.5 hours. A release layer was prepared.

Example 3

Preparation of Polyimide (B1317-BAPPm, BB)/Parylene/Glass Substrate Structure

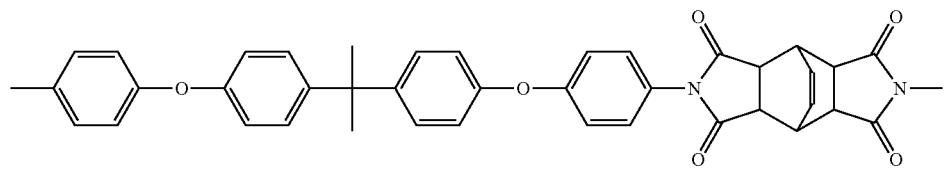

0.0147 mole diphenylamine (BAPPm) was completely dissolved in 32.94 g cresol under nitrogen at room temperature. 0.015 mole dianhydride (B1317) was then added and continuously stirred for 1 hour after dianhydride (B1317) was completely dissolved to form a sticky polyamic acid (PAA) solution. Next, the PAA solution was thermally imidized (220° C.) for 3 hours, and water was simultaneously removed. Methanol was finally added to the resulting solution to precipitate polyimide and baked in a vacuum oven for 12 hours. After baking, polyimide (with 20% solid content) was dissolved in DMAc to form a polyimide solution. A tape was stuck on a determined area of a glass plated with 8 cm×8 cm parylene with an area (10 cm×10 cm). The polyimide solution was then coated on the glass plated with 8 cm×8 cm parylene with an area (10 cm×10 cm) using a blade. The tape was removed. The glass was baked in various temperature ovens (80° C. and 150° C.) for 1 hour. A polyimide (BB)/parylene/glass substrate structure was prepared.

Example 4

Preparation of Silicon Dioxide/Polyimide (BB-37)/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.3 g amino siloxane was then added to prepare a solution, and stirred for 30 min at room temperature. A tape was stuck on a determined area of a glass plated with parylene. Next, the solution was coated on the glass plated with parylene using a blade. The tape was removed. The glass was then baked in various temperature ovens (80° C. and 150° C.) for 1 hour. A silicon dioxide/polyimide (BB-37)/parylene/glass substrate structure was prepared.

Example 5

Preparation of Silicon Dioxide/Polyimide (BB-55)/Parylene/Glass Substrate Structure 5 g silicon dioxide (with 20% solid content dissolved in DMAc) and 5 g B1317-BAPPm (BB) (with 20% solid content dissolved in DMAc) were placed in a sample bottle. 0.2 g amino siloxane was then added to prepare a solution, and stirred for 30 min at room temperature. A tape was stuck on a determined area of a glass plated with parylene. Next, the solution was coated on the glass plated with parylene using a blade. The tape was removed. The glass was then baked in various temperature ovens (80° C. and 150° C.) for 1 hour. A silicon dioxide/polyimide (BB-55)/parylene/glass substrate structure was prepared.

Example 6

Preparation of Silicon Dioxide/Polyimide (BB-73)/Parylene/Glass Substrate Structure 7 g silicon dioxide (with 20% solid content dissolved in DMAc) and 3 g B1317-BAPPm (BB) (with 20% solid content dissolved in DMAc) were placed in a sample bottle. 0.12 g amino siloxane was then added to prepare a solution, and stirred for 30 min at room temperature. A tape was stuck on a determined area of a glass plated with parylene. Next, the solution was coated on the glass plated with parylene using a blade. The tape was removed. The glass was then baked in various temperature ovens (80° C. and 150° C.) for 1 hour. A silicon dioxide/polyimide (BB-73)/parylene/glass substrate structure was prepared.

Example 7

Preparation of Tetraethoxysilane (TEOS)/Polyimide (BB)/Topas/Glass Substrate Structure 0.2 g tetraethoxysilane (TEOS) and 10 g B1317-BAPPm (BB) (with 20% solid content dissolved in DMAc) were placed in a sample bottle to prepare a solution. A tape was stuck on a determined area of a glass coated with Topas. Next, the solution was coated on the glass coated with Topas using a blade. The tape was removed. The glass was then baked in various temperature ovens (80° C. and 150° C.) respectively for 1 hour. A tetraethoxysilane (TEOS)/polyimide (BB)/Topas/glass substrate structure was prepared.

Example 8

Preparation of Amino Silane/Polyimide (BB)/Zeonor/Glass Substrate Structure 0.2 g amino silane and 10 g B1317-BAPPm (BB) (with 20% solid content dissolved in DMAc) were placed in a sample bottle to prepare a solution. A tape was stuck on a determined area of a glass coated with Zeonor. Next, the solution was coated on the glass coated with Zeonor using a blade. The tape was removed. The glass was then baked in various temperature ovens (80° C. and 150° C.) for 1 hour. An amino silane/polyimide (BB)/Zeonor/glass substrate structure was prepared.

Example 9

Preparation of 3-(Methacryloxy)Propyl Trimethoxy Silane (MPMS)/Polyimide (BB)/Arton/Glass Substrate Structure 0.2 g 3-(methacryloxy) propyl trimethoxy silane (MPMS) and 10 g B1317-BAPPm (BB) (with 20% solid content dissolved in DMAc) were placed in a sample bottle to prepare a solution. A tape was stuck on a determined area of a glass coated with Arton. Next, the solution was coated on the glass coated with Arton using a blade. The tape was removed. The glass was then baked in various temperature ovens (80° C. and 150° C.) for 1 hour. A 3-(methacryloxy) propyl trimethoxy silane (MPMS)/polyimide (BB)/Arton/glass substrate structure was prepared.

After the substrate structure was prepared, various devices were fabricated on the substrate. After device fabrication was completed, a portion of the flexible substrate was divided to separate the flexible substrate with the devices fabricated thereon from the carrier.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A substrate structure applied in flexible devices, comprising:
    a carrier;
    a release layer with a first area formed on the carrier, which has a first adhesion force to the carrier; and
    a flexible substrate with a second area overlying and physically contacting with part of the first area of the release layer to form an overlapping area therebetween, and part of the flexible substrate outside the overlapping area physically contacting with the carrier, which has a second adhesion force to the release layer and a third adhesion force to the carrier,
    wherein the first area is larger than or equal to the second area, the third adhesion force is greater than the first adhesion force, and the first adhesion force is greater than the second adhesion force.

2. The substrate structure applied in flexible devices as claimed in claim 1, wherein the part of the flexible substrate and the release layer outside the overlapping area are in an alternate arrangement on the carrier surrounding the overlapping area.

3. The substrate structure applied in flexible devices as claimed in claim 1, wherein the release layer further comprises at least one extending area outside the flexible substrate uncovered by the flexible substrate.

4. The substrate structure applied in flexible devices as claimed in claim 1, wherein the second adhesion force of the flexible substrate to the release layer is less than or equal to 50 gf/inch.

5. The substrate structure applied in flexible devices as claimed in claim 1, wherein the third adhesion force of the flexible substrate to the carrier is greater than 50 gf/inch.

* * * * *